United States Patent
Cypher

(10) Patent No.: US 8,683,294 B1
(45) Date of Patent: Mar. 25, 2014

(54) EFFICIENT ENCODING OF HOMED DATA

(75) Inventor: Robert Cypher, Saratoga, CA (US)

(73) Assignee: Google Inc., Mountain View, CA (US)

( * ) Notice: Subject to any disclaimer, the term of this patent is extended or adjusted under 35 U.S.C. 154(b) by 258 days.

(21) Appl. No.: 13/162,235

(22) Filed: Jun. 16, 2011

Related U.S. Application Data

(60) Provisional application No. 61/355,261, filed on Jun. 16, 2010.

(51) Int. Cl.
*G11C 29/00* (2006.01)

(52) U.S. Cl.
USPC .......................................................... 714/763

(58) Field of Classification Search
USPC .................................... 714/40, 763; 711/100
See application file for complete search history.

(56) References Cited

U.S. PATENT DOCUMENTS

| | | | |
|---|---|---|---|
| 6,032,269 A | 2/2000 | Renner | |
| 6,151,641 A | 11/2000 | Herbert | |
| 6,216,247 B1 | 4/2001 | Creta et al. | |
| 6,378,038 B1 | 4/2002 | Richardson et al. | |
| 6,721,317 B2 | 4/2004 | Chong | |
| 7,356,752 B2 | 4/2008 | Hewitt et al. | |
| 7,398,459 B2 | 7/2008 | Park et al. | |
| 7,505,890 B2 | 3/2009 | Kuznetsov et al. | |
| 7,546,484 B2 | 6/2009 | Sen et al. | |
| 7,624,229 B1 | 11/2009 | Longinov | |
| 7,676,730 B2 | 3/2010 | Haugan et al. | |
| 7,739,446 B2 | 6/2010 | Kano | |
| 7,774,681 B2 | 8/2010 | Earhart et al. | |
| 7,831,764 B2 | 11/2010 | Nakajima et al. | |
| 7,861,035 B2 | 12/2010 | Baek et al. | |
| 7,861,052 B2 | 12/2010 | Kawamura et al. | |
| 8,065,555 B2 | 11/2011 | Maiyuran et al. | |
| 8,082,393 B2 | 12/2011 | Galloway et al. | |
| 8,086,783 B2 | 12/2011 | O Connor et al. | |
| 8,090,792 B2 | 1/2012 | Dubnicki et al. | |
| 8,140,753 B2 | 3/2012 | Galloway et al. | |
| 8,145,865 B1 | 3/2012 | Longinov et al. | |
| 8,176,247 B2 | 5/2012 | Galloway et al. | |
| 8,180,954 B2 | 5/2012 | Kilzer et al. | |
| 8,213,205 B2 | 7/2012 | Rajan | |
| 8,234,539 B2 | 7/2012 | Erez | |

(Continued)

OTHER PUBLICATIONS

Witold Litwin, Rim Moussa, and Thomas Schwarz. 2005. LH*RS—a highly-available scalable distributed data structure. ACM Trans. Database Syst. 30, 3 (Sep. 2005), 769-811.*

(Continued)

*Primary Examiner* — Cynthia Britt
(74) *Attorney, Agent, or Firm* — Fish & Richardson P.C.

(57) ABSTRACT

Methods, systems, and apparatus, including computer programs encoded on a computer storage medium, for skewed orthogonal coding techniques. In one aspect, a method includes receiving a first block of data chunks and a second block of data chunks. Data from the first block is specified to be stored at a first group of storage nodes, and data from the second block is specified to be stored at the second group of storage nodes. The first block of data chunks are stored at the first group of storage nodes and the second block of data chunks are stored at the second group of storage nodes. A block of code chunks is stored at the third group of storage nodes, wherein each code chunk is generated using an error-correcting code and corresponding data chunks from the first and second blocks.

21 Claims, 5 Drawing Sheets

(56) References Cited

U.S. PATENT DOCUMENTS

| | | |
|---|---|---|
| 8,255,761 B1 | 8/2012 | Pi et al. |
| 8,279,755 B2 | 10/2012 | Luby |
| 8,307,258 B2 | 11/2012 | Flynn et al. |
| 8,327,234 B2 | 12/2012 | Earnshaw et al. |
| 8,327,237 B2 | 12/2012 | Buckley et al. |
| 8,386,889 B1 * | 2/2013 | Tang et al. .............. 714/770 |
| 2003/0056068 A1 | 3/2003 | McAllister et al. |
| 2003/0149750 A1 | 8/2003 | Franzenburg |
| 2005/0091234 A1 | 4/2005 | Hsu et al. |
| 2006/0080505 A1 | 4/2006 | Arai et al. |
| 2008/0256183 A1 * | 10/2008 | Flynn et al. .............. 709/204 |
| 2009/0262839 A1 | 10/2009 | Shelby et al. |
| 2009/0265578 A1 | 10/2009 | Baloun et al. |
| 2010/0037117 A1 | 2/2010 | Pescatore |
| 2010/0217915 A1 | 8/2010 | O Connor et al. |
| 2011/0035548 A1 * | 2/2011 | Kimmel et al. ............ 711/114 |
| 2011/0258161 A1 | 10/2011 | Constantinescu et al. |
| 2011/0296277 A1 * | 12/2011 | Flynn et al. .............. 714/773 |
| 2012/0036333 A1 | 2/2012 | Lecrone et al. |
| 2012/0042142 A1 | 2/2012 | Garman et al. |
| 2012/0042200 A1 | 2/2012 | Takeuchi et al. |
| 2012/0042201 A1 | 2/2012 | Resnick |
| 2012/0131383 A1 | 5/2012 | Galloway et al. |
| 2012/0221924 A1 * | 8/2012 | Flynn et al. .............. 714/763 |
| 2012/0246548 A1 | 9/2012 | Buckley et al. |

OTHER PUBLICATIONS

Bartlett, W.; Spainhower, L., "Commercial fault tolerance: a tale of two systems," Dependable and Secure Computing, IEEE Transactions on , vol. 1, No. 1, pp. 87,96, Jan.-Mar. 2004.*

Wikipedia; Reed Solomon; http://en.wikipedia.org/wiki/Reed_Solomon; 14 pages.

Hafner, James; "HoVer Erasure Codes for Disk Arrays;" Proceedings of the 2006 International Conference on Dependable Systems and Networks; pp. 217-226; 2006; 10 pages.

Li, Mingqiang; "GRID Codes: Strip-Based Erasure Codes with High Fault Tolerance for Storage Systems;" ACM Transactions on Storage, vol. 4, No. 4, Article 15, Jan. 2009; 22 pages.

Duminuco, Alessandro; "Hierarchical Codes: How to Make Erasure Codes Attractive for Peer-to-Peer Storage Systems;" Proceedings of the Eighth International Conference on Peer-to-Peer Computing; 2008 (P2P'08), pp. 8-11; 10 pages.

Wikipedia; Reed Solomon; http://en.wikipedia.org/wiki/Reed_Solomon; last modified Sep. 13, 2006, 14 pages.

* cited by examiner

EFFICIENT ENCODING OF HOMED DATA

CROSS-REFERENCE TO RELATED APPLICATIONS

This application claims the benefit under 35 U.S.C. §119(e) of U.S. Patent Application No. 61/355,261, entitled "Techniques for Data Storage, Access, and Maintenance," filed Jun. 16, 2010, which is incorporated herein by reference in its entirety.

BACKGROUND

This specification relates to digital data processing and, in particular, data storage, access, and maintenance.

Important data is conventionally stored on storage devices that potentially fail. The data can be backed-up and stored redundantly so that the data can be recovered if a storage device fails. Conventional data centers can store large amounts of data. Some data is stored redundantly across multiple data centers so that even if an entire data center fails the data can be recovered.

Data can be stored using error-detecting codes. An error-detecting code adds extra data to the data that enables detection of certain errors in the data. One example of an error-detecting code is a cyclic redundancy check (CRC). CRC codes are used to detect failures on storage devices (e.g., hard disk drives).

Data can also be stored using error-correcting codes. An error-correcting code adds extra data to the data that enables correction of errors in the data. The number of errors that can be corrected is limited by the amount of extra data that is added. Examples of error-correcting codes include Reed-Solomon codes.

SUMMARY

An encoding system stores data at groups of storage nodes, e.g., data centers. Data chunks are specified to be stored at certain data centers ("home" data centers), e.g., because it is more likely to be accessed at those data centers. For example, data chunks of a user's email message can be stored at a data center that is determined to be geographically closer to the user's residence than other data centers. Error-correcting code chunks are stored at other data centers. The error-correcting code chunks are based on data chunks from at least two different home data centers. The error-correcting code chunks can be used to reconstruct damaged chunks even if an entire data center fails completely.

In general, one innovative aspect of the subject matter described in this specification can be embodied in methods that include the actions of receiving a first block of data chunks and a second block of data chunks; determining that data from the first block is specified to be stored at a first group of storage nodes and available for access from the first group of storage nodes without access to a second group of storage nodes or a third group of storage nodes, and that data from the second block is specified to be stored at the second group of storage nodes and available for access from the second group of storage nodes without access to the first group of storage nodes or the third group of storage nodes; storing the first block of data chunks at the first group of storage nodes and the second block of data chunks at the second group of storage nodes; and storing a block of code chunks at the third group of storage nodes, wherein each code chunk is generated using an error-correcting code and corresponding data chunks from the first and second blocks. Other embodiments of this aspect include corresponding systems, apparatus, and computer programs, configured to perform the actions of the methods, encoded on computer storage devices.

These and other embodiments can each optionally include one or more of the following features. Determining that data from the first block is specified to be stored at a first group of storage nodes comprises determining that the data from the first block is more likely to be accessed at the first group of storage nodes than at the second group of storage nodes. Storing the block of error-correcting code chunks at the third group of storage nodes comprises: determining that a first data chunk of the first block is associated with an identifier; determining that a second data chunk of the second block is associated with the identifier; generating a code chunk based on the first and second data chunks; and associating the code chunk with the identifier. The actions further include: identifying a damaged data chunk at the first group of storage nodes; and reconstructing the damaged chunk using the corresponding data chunk from the second group of storage nodes and the corresponding code chunk from the third group of storage nodes. The actions further include: receiving an update for the second block of data; and updating the second block of data at the second group of storage nodes and the code chunks at the third group of storage nodes. The updating is performed in accordance with a transactional commit protocol. The transactional commit protocol is a two-phase commit protocol. The actions further include: storing a first block of error-correcting code chunks at the first group of storage nodes, wherein the first block of error-correcting code chunks are based on the data chunks of the first block of data chunks.

Particular embodiments of the subject matter described in this specification can be implemented so as to realize one or more of the following advantages. Data chunks having home data centers can be stored at those data centers, and error-correcting code chunks can be stored at other data centers so that the data chunks can be reconstructed even if an entire home data center fails. An encoding system can store x*n bytes of data, all of which has a home data center at one of x data centers, while tolerating the loss of any given data center and while using less than 2*x*n total bytes of storage.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
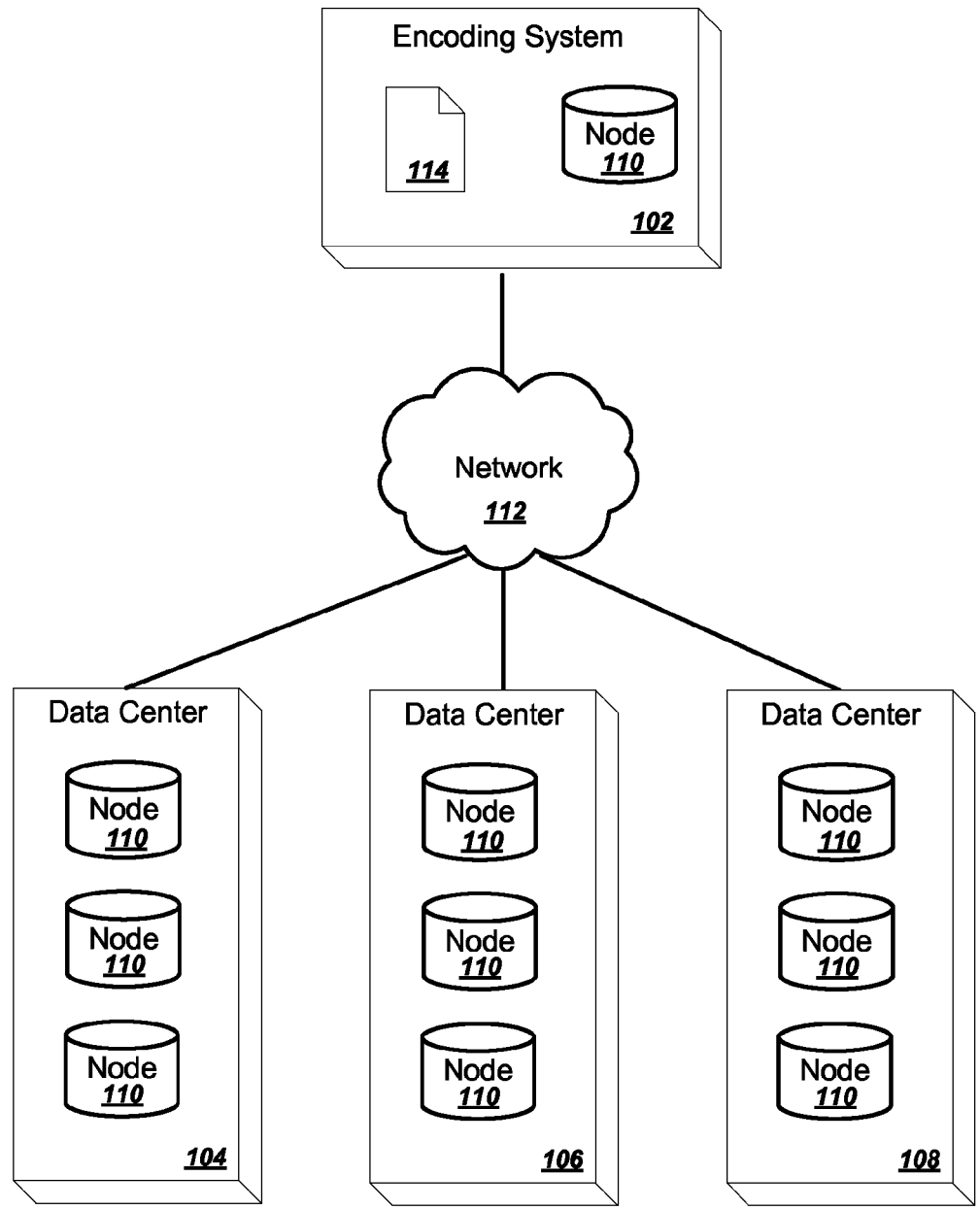
FIG. 1 is a schematic diagram of an example encoding system configured to store data having a specified home group of storage nodes.

FIG. 1 is a schematic diagram of an example encoding system 102 configured to store data having a specified home group of storage nodes.

The encoding system 102 comprises one or more data processing apparatus. The encoding system 102 can store data chunks from a file 114 data at, for example, one or more local storage nodes 114, across storage nodes 110 at data centers 104, 106, and 108, or both. The encoding system 102 can also store redundant copies of data chunks and error-correcting code chunks. The encoding system communicates with the data centers 104, 106, and 108 using a network 112.

A storage node includes one or more computer storage mediums. In some implementations, a storage node is a data server, for example, a server including a data processing apparatus and multiple hard disk drives on which data can be stored. A group of storage nodes can include a rack, a sub-network, a data center, or various other collections of servers or storage nodes.

A data center is a group of storage nodes. Typically, a data center is a facility with physical space for computer systems. Data centers can include, for example, telecommunication systems, backup power supplies, climate controls, security. In FIG. 1, the data centers 104, 106, and 108 are shown with three storage nodes; however, each data center can have more or fewer storage nodes.

A data chunk is a specified amount of data. In some implementations, a data chunk is a contiguous portion of data from a file. In other implementations, a data chunk is one or more non-continuous portions of data from a file. For example, a data chunk can be 256 bytes or other units of data.

A damaged chunk is a chunk containing one or more errors. Typically, a damaged chunk is identified using an error detecting code. For example, a damaged chunk can be completely erased (e.g., if the chunk was stored in a hard drive destroyed in a hurricane), or a damaged chunk can have a single bit flipped. A healthy chunk is a chunk that is not damaged.

An error-correcting code chunk includes a chunk of data based on one or more data chunks. In some implementations, each code chunk is the same specified size (e.g., 256 bytes) as the data chunks. The code chunks are generated using an error-correcting code, e.g., a Maximal Distance Separable (MDS) code. Examples of MDS codes include Reed-Solomon codes. Various techniques can be used to generate the code chunks. In general, any error-correcting code can be used that can reconstruct d data chunks from any set of d unique, healthy chunks (either data chunks or code chunks). Data chunks can be specified to be stored at certain data centers ("home" data centers). Data is homed if the data is specified to be available at its home data center without access to other data centers. Data that is determined to be more likely to be accessed at a certain data center can be specified to be available at that data center. For example, data can be specified to be stored at a data center based on the data center's geographic location. Suppose the encoding system 102 receives a file over the Internet. The encoding system 102 can determine a geographic location for the file, e.g., using an Internet Protocol (IP) address for a sender of the file and an IP address to geographic location mapping, and then specify that the file is homed to a data center that is closer than other data centers to the determined geographic location for the file.

In some implementations, metadata is used at the encoding system 102 or the data centers 104, 106, and 108 or both to keep track of data. For example, the metadata can specify which parts of a file are stored at which data centers, where redundant copies of data are stored, which data chunks and code chunks form codewords, and the like.

Figure 2:
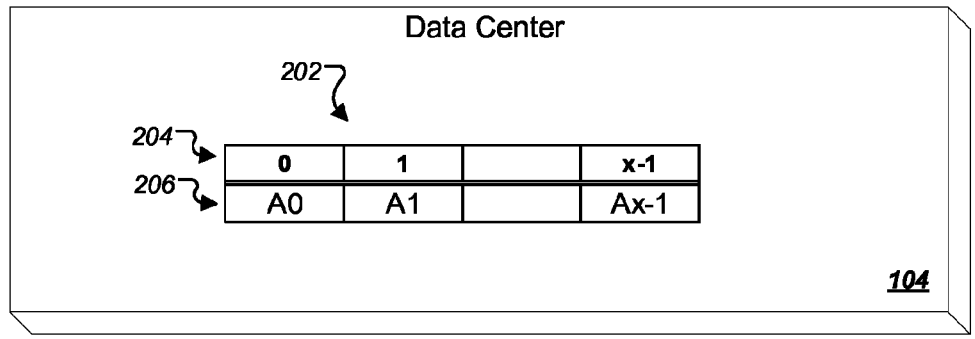
FIG. 2 is a schematic diagram of three example data centers storing data chunks A0 . . . Ax−1 and B0 . . . Bx−1.
Figure 2:
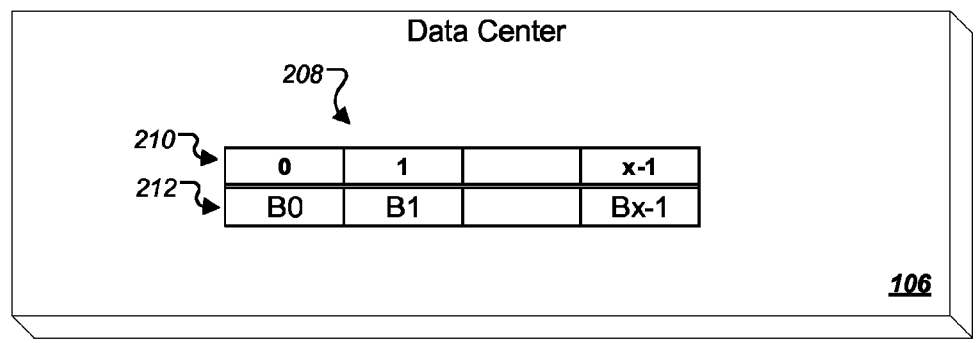
Figure 2:
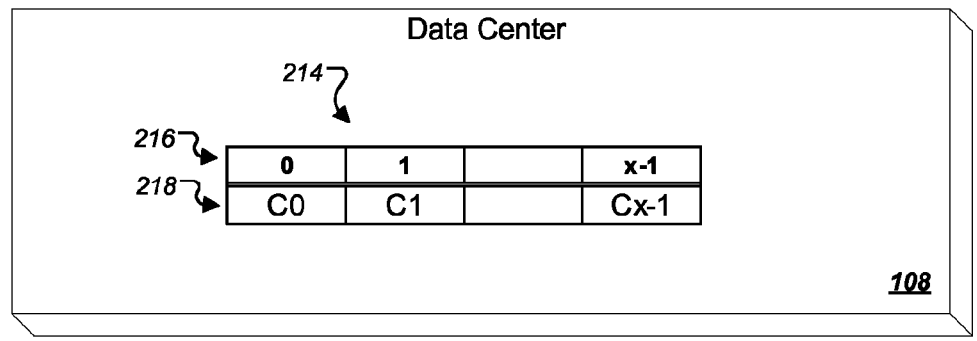

FIG. 2 is a schematic diagram of three example data centers 104, 106, and 108 storing data chunks A0 . . . Ax−1 and B0 . . . Bx−1. Data chunks A0 . . . Ax−1 are homed to the first data center 104 and data chunks B0 . . . Bx−1 are homed to the second data center 106.

Code chunks C0 . . . Cx−1 at the third data center are generated using corresponding data chunks from the first two data centers 104 and 106. For example, C0 is based on A0 and B0 (generated using any appropriate error-correcting code.) Corresponding data chunks can be identified in various ways. An intermediate namespace can be used in each data center that specifies how corresponding data chunks are identified.

For example, each data center can have a coding address space in which blocks of data that are stored in the data center are numbered with unique identifiers (block numbers). A logical file can then map to some collection of numbered blocks in this coding address space, and the numbered blocks can then map to individual servers and disks by using, e.g., a fixed mapping or another mapping table. Then, the blocks in different data centers are encoded with one another based on their block numbers in their respective coding address spaces, e.g., so that corresponding blocks have the same block number.

To illustrate one example of using identifiers, FIG. 2 illustrates data chunks and identifiers in the data centers as tables 202, 208 and 214. The tables have rows 204, 210, and 216 of identifiers and rows 208, 212, and 218 of chunks. A chunk in the first data center 104 has a corresponding chunk in the second data center 106 having the same identifier as the chunk in the first data center 104. So, for example, A0 and B0 are corresponding chunks because they both have the same identifier, 0. Code chunk C0 also has the identifier 0 so it is generated using A0 and B0. If A0 is determined to be damaged, it can be reconstructed using the chunks having the identifier 0 from the other data centers (B0 and C0).

A total of 3*x chunks are stored between the three data centers, including 2*x data chunks and x code chunks. Chunks A0 . . . Ax−1 are available at the first data center 104 without accessing the other two data centers 106 and 108. Chunks B0 . . . Bx−1 are available at the second data center 106 without accessing the other two data centers 104 and 108. If all of the data at any one of the data centers is lost, all of the data can be reconstructed using the data at the remaining two data centers.

Storing data and code chunks in this manner resolves a tension between specifying a home data center for data and making that data safe in the event of the complete failure of any data center. Instead of having to store twice the amount of data chunks (4*x), only 3*x chunks need to be stored.

Error-correcting code chunks can also be stored locally at the first two data centers 104 and 106 for local recovery of damaged chunks. Any appropriate error-correcting code can be used locally. Those code chunks can then be used in generating additional code chunks at the third data center 108 as described above for the data chunks.

It some cases, the data being stored at different data centers will be produced or modified at unrelated times, creating a temporal coordination problem in creating and managing the code chunks, and in reconstructing damaged chunks. Various techniques can be used to create and update code chunks, and reconstruct damaged chunks, while maintaining the ACID properties (atomicity, consistency, isolation, and durability). In general, the corresponding chunks are locked to prevent changes during an update operation or reconstruction operation. Locking the chunks includes sending messages between data centers specifying chunks that need to be locked.

For example, the data centers can be initially configured with all blocks in the coding address space containing zeros. Then, when new data is stored (e.g., as part of a file write or append operation), an atomic read-modify-write operation can be performed on the data blocks in the home data center for the data and to each of the code blocks that correspond to those data blocks. The data block atomic read-modify-write operations determine how the write changes the data and thus how the code blocks are modified. The read-modify-write operations are atomic across the multiple DCs, e.g., in that no two operations partially modify corresponding data blocks. The read-modify-write operations performed at different data centers can be performed at different times, provided that enough information is present to reconstruct the data if the ongoing read-modify-write operations fail part way through (which will depend on the specific technique used to order the read-modify-write operations that provide the ACID properties.) One example technique for ordering the read-modify-write operations is a two-phase commit protocol.

Although the example illustrated shows three data centers, the general idea described can be extended for different numbers of blocks of homed data and different numbers of code chunks. For example, suppose that there are six data centers and five files to be stored across the data centers, each file including n bytes and being homed to a different data center. One possible way of storing the data is to use an orthogonal code using Reed-Solomon encoding with 8 data chunks and 2 code chunks in each of the data centers, and a parity code across data centers so that one data center has the XOR of the data stored at the other five data centers. In this manner, the 5n bytes can be stored using $(5n)*(10/8)*(6/5)=7.5*n$ bytes of storage. Each file is stored at its home data center, and all of the data can be reconstructed if a single data center fails.

Figure 3:
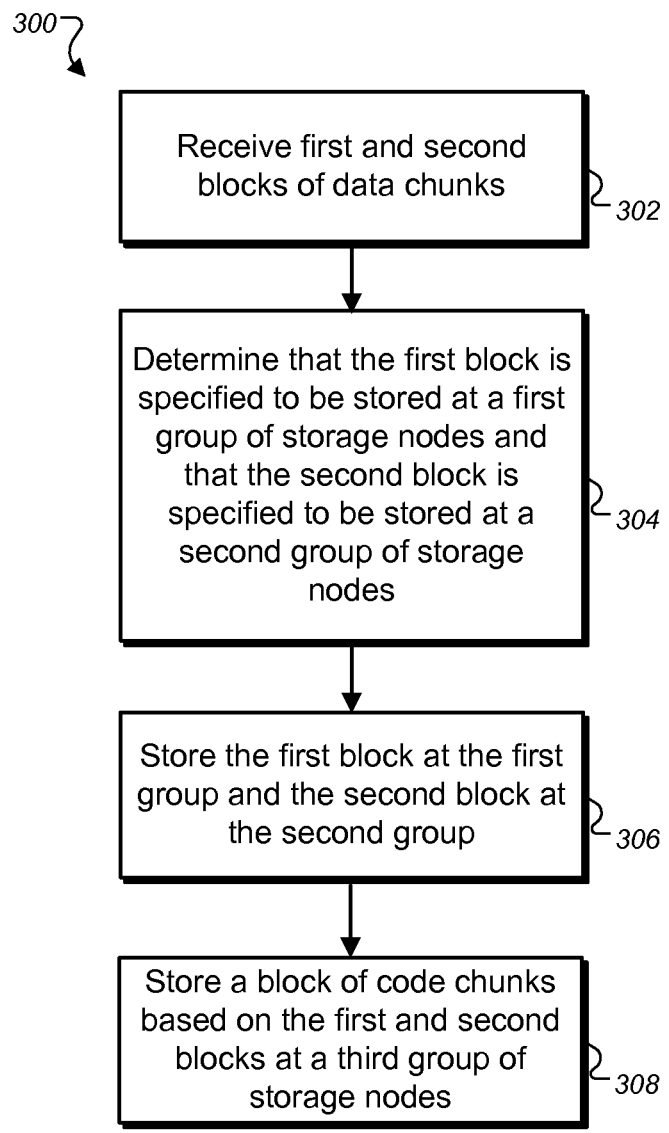
FIG. 3 is a flow diagram of an example process for storing data having specified home groups of storage nodes.

FIG. 3 is a flow diagram of an example process 300 for storing data having specified home groups of storage nodes. The process 300 can be performed by, for example, a system of one or more data processing apparatus (e.g., the encoding system 102 of FIG. 1). For purposes of illustration, the process 300 will be described with respect to a system that performs the process 300.

The system receives a first block of data chunks and a second block of data chunks (step 302). For example, each block of data chunks can be a file.

The system determines that data from the first block is specified to be stored at a first group of storage nodes, and that data from the second block is specified to be stored at a second group of storage nodes (step 304). The data from the first block is specified to be available for access from the first group of storage nodes without access to the second group of storage nodes or a third group of storage nodes, and the data from the second block is specified to be available for access from the second group of storage nodes without access to the first group of storage nodes or the third group of storage nodes.

The system stores the first block of data chunks at the first group of storage nodes and the second block of data chunks at the second group of storage nodes (step 306). The system can optionally store local error-correcting code chunks at each of the groups of storage nodes.

The system stores a block of code chunks at the third group of storage nodes (step 308). Each code chunk is generated using an error-correcting code and corresponding data chunks from the first and second blocks. The system identifies corresponding data chunks, e.g., as described above with reference to FIG. 2.

When the system identifies a damaged data chunk at the first group of storage nodes (e.g., using an error-detecting code), the system reconstructs the damaged chunk using the corresponding data chunk from the second group of storage nodes and the corresponding code chunk from the third group of storage nodes.

Figure 4:
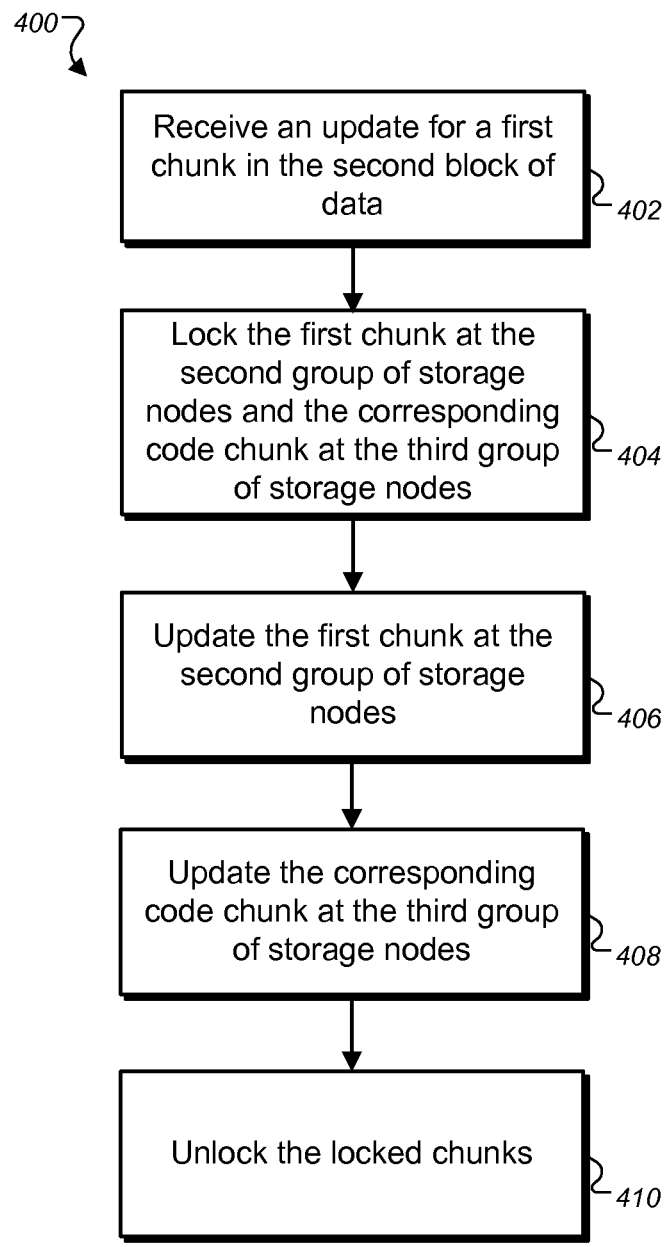
FIG. 4 is a flow diagram of an example process for updating an error-correcting code chunk stored as described above with reference to FIG. 3.

FIG. 4 is a flow diagram of an example process 400 for updating an error-correcting code chunk stored as described above with reference to FIG. 3. The process 400 can be performed by, for example, a system of one or more data processing apparatus (e.g., the encoding system 102 of FIG. 1). For purposes of illustration, the process 400 will be described with respect to a system that performs the process 400.

The system receives an update for a first chunk in the second block of data (step 402). For example, the system can receive a new file or an update to a file.

The system locks the first chunk at the second group of storage nodes and the corresponding code chunk at the third group of storage nodes (step 404). For example, the second group of storage nodes can send a message to the third group of storage nodes to lock the corresponding code chunk for the first chunk.

The system updates the first chunk at the second group of storage nodes (step 406) and the corresponding code chunk at the third group of storage nodes (step 408). For example, the system can perform a read-modify-write operation on the first chunk at the second group of storage nodes and a read-modify-write operation on the corresponding code chunk at the third group of storage nodes. If the error-correcting code used to generate the code chunks is a linear code, the corresponding code chunk at the third group of storage nodes can be updated without reading the corresponding data chunk from the first group of storage nodes. The updated code chunk can be based on the old value of the first code chunk, the old value of the first data chunk in the second block of data, and the new value of the first data chunk in the second block of data. After the system completes the updates, the system unlocks the first chunk at the second group of storage nodes and the corresponding code chunk at the third group of storage nodes.

The locking and updating can be performed in accordance with a transactional commit protocol. For example, the transactional commit protocol can be a two-phase commit protocol.

Figure 5:
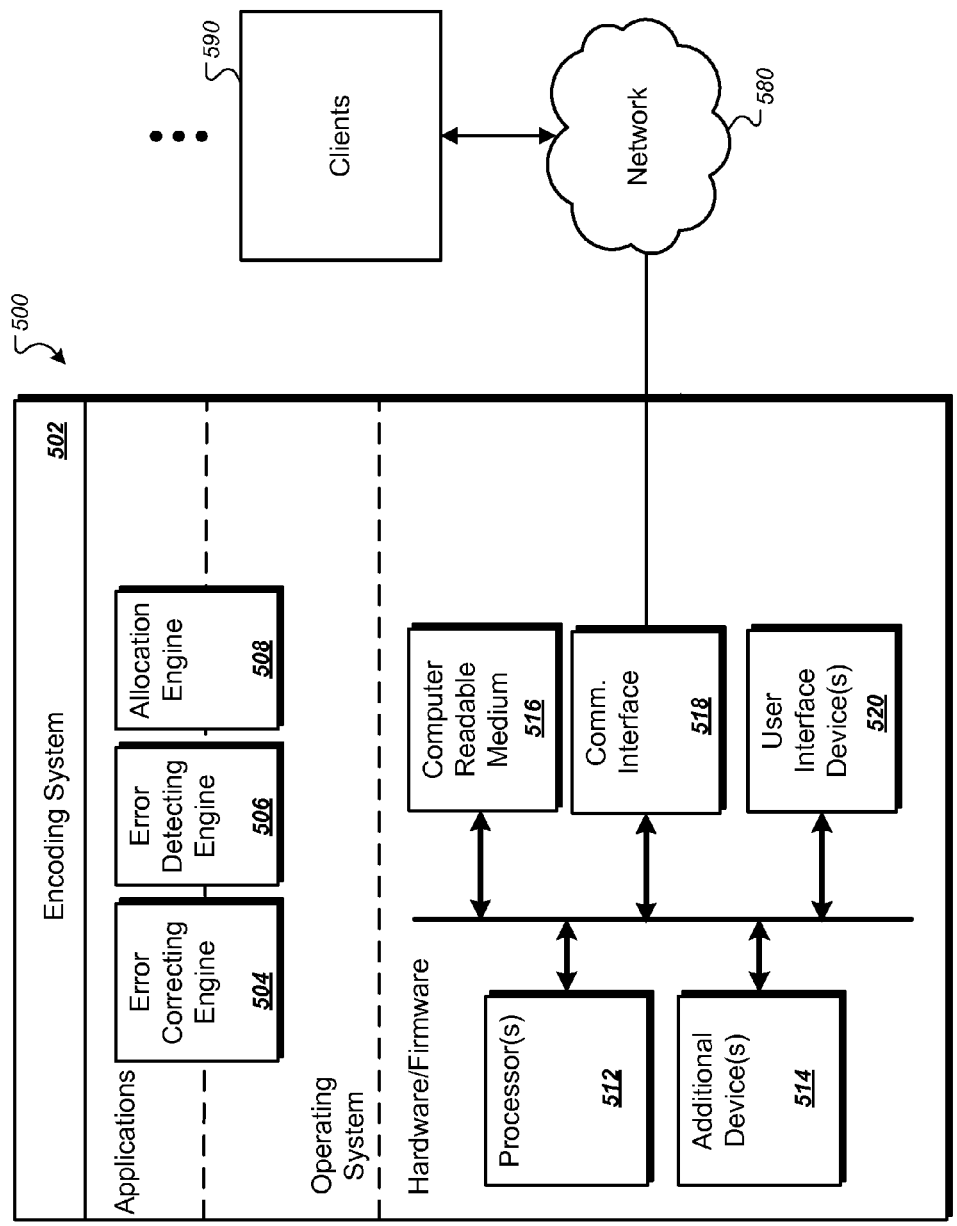
FIG. 5 is a schematic diagram of an example system configured for data storage, access, and maintenance.

FIG. 5 is a schematic diagram of an example system configured for data storage, access, and maintenance. The system generally consists of an encoding system 502 of one or more computers. The system 502 is optionally connected to one or more user or client computers 590 through a network 580. The system 502 includes various modules, e.g. executable software programs, including an error correcting engine 504 for generating code chunks and reconstructing damaged chunks. An error detecting code engine 506 is configured to identify damaged chunks of data. An allocation engine 508 allocates code chunks and data chunks between one or more groups of storage nodes.

Each module runs as part of the operating system on the system 502, runs as an application on the system 502, or runs as part of the operating system and part of an application on the system 502, for instance. Although several software modules are illustrated, there may be fewer or more software modules. Moreover, the software modules can be distributed on one or more data processing apparatus connected by one or more networks or other suitable communication mediums.

The system 502 also includes hardware or firmware devices including one or more processors 512, one or more additional devices 514, a computer readable medium 516, a communication interface 518, and optionally one or more user interface devices 520. Each processor 512 is capable of processing instructions for execution within the system 502. In some implementations, the processor 512 is a single or multi-threaded processor. Each processor 512 is capable of processing instructions stored on the computer readable medium 516 or on a storage device such as one of the additional devices 514. The system 502 uses its communication interface 518 to communicate with one or more computers 590, for example, over a network 580.

In some implementations, the system 502 does not have any user interface devices. In other implementations, the system 502 includes one or more user interface devices. Examples of user interface devices 520 include a display, a camera, a speaker, a microphone, a tactile feedback device, a keyboard, and a mouse. The system 502 can store instructions that implement operations associated with the modules described above, for example, on the computer readable medium 516 or one or more additional devices 514, for example, one or more of a floppy disk device, a hard disk device, an optical disk device, or a tape device.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method performed by one or more computers, the method comprising:
   receiving a first block of data chunks and a second block of data chunks;
   determining that data from the first block is specified to be stored at a first group of storage nodes and available for access from the first group of storage nodes without access to a second group of storage nodes or a third group of storage nodes, and that data from the second block is specified to be stored at the second group of storage nodes and available for access from the second group of storage nodes without access to the first group of storage nodes or the third group of storage nodes;
   storing the first block of data chunks at the first group of storage nodes and the second block of data chunks at the second group of storage nodes; and
   storing a block of code chunks at the third group of storage nodes, wherein each code chunk is generated using an error-correcting code and corresponding data chunks from the first and second blocks,
   wherein each of the first, second and third groups of storage nodes is within a respective different data center in a different geographic location, and
   wherein determining that data from the first block is specified to be stored at a first group of storage nodes comprises determining that a geographic location is specified for the data and determining that the geographic location specified for the data is geographically closer to the first group of storage nodes than the second group of storage nodes.

2. The method of claim 1, wherein storing the block of error-correcting code chunks at the third group of storage nodes comprises:
   determining that a first data chunk of the first block is associated with an identifier;
   determining that a second data chunk of the second block is associated with the identifier;
   generating a code chunk based on the first and second data chunks; and
   associating the code chunk with the identifier.

3. The method of claim 1, further comprising:
   identifying a damaged data chunk at the first group of storage nodes; and
   reconstructing the damaged chunk using the corresponding data chunk from the second group of storage nodes and the corresponding code chunk from the third group of storage nodes.

4. The method of claim 1, further comprising:
   receiving an update for the second block of data; and
   updating the second block of data at the second group of storage nodes and the code chunks at the third group of storage nodes.

5. The method of claim 4, wherein the updating is performed in accordance with a transactional commit protocol.

6. The method of claim 5, wherein the transactional commit protocol is a two-phase commit protocol.

7. The method of claim 1, further comprising storing a first block of error-correcting code chunks at the first group of storage nodes, wherein the first block of error-correcting code chunks are based on the data chunks of the first block of data chunks.

8. A system of one or more computers configured to perform operations comprising:
   receiving a first block of data chunks and a second block of data chunks;

determining that data from the first block is specified to be stored at a first group of storage nodes and available for access from the first group of storage nodes without access to a second group of storage nodes or a third group of storage nodes, and that data from the second block is specified to be stored at the second group of storage nodes and available for access from the second group of storage nodes without access to the first group of storage nodes or the third group of storage nodes;

storing the first block of data chunks at the first group of storage nodes and the second block of data chunks at the second group of storage nodes; and storing a block of code chunks at the third group of storage nodes, wherein each code chunk is generated using an error-correcting code and corresponding data chunks from the first and second blocks, wherein each of the first, second and third groups of storage nodes is within a respective different data center in a different geographic location, and wherein determining that data from the first block is specified to be stored at a first group of storage nodes comprises determining that a geographic location is specified for the data and determining that the geographic location specified for the data is geographically closer to the first group of storage nodes than the second group of storage nodes.

9. The system of claim 8, wherein storing the block of error-correcting code chunks at the third group of storage nodes comprises:

determining that a first data chunk of the first block is associated with an identifier;

determining that a second data chunk of the second block is associated with the identifier;

generating a code chunk based on the first and second data chunks; and associating the code chunk with the identifier.

10. The system of claim 8, the operations further comprising:

identifying a damaged data chunk at the first group of storage nodes; and reconstructing the damaged chunk using the corresponding data chunk from the second group of storage nodes and the corresponding code chunk from the third group of storage nodes.

11. The system of claim 8, the operations further comprising:

receiving an update for the second block of data; and updating the second block of data at the second group of storage nodes and the code chunks at the third group of storage nodes.

12. The system of claim 11, wherein the updating is performed in accordance with a transactional commit protocol.

13. The system of claim 12, wherein the transactional commit protocol is a two-phase commit protocol.

14. The system of claim 8, the operations further comprising storing a first block of error-correcting code chunks at the first group of storage nodes, wherein the first block of error-correcting code chunks are based on the data chunks of the first block of data chunks.

15. A non-transitory computer storage medium encoded with a computer program, the program comprising instructions that when executed by one or more computers cause the computers to perform operations comprising:

receiving a first block of data chunks and a second block of data chunks;

determining that data from the first block is specified to be stored at a first group of storage nodes and available for access from the first group of storage nodes without access to a second group of storage nodes or a third group of storage nodes, and that data from the second block is specified to be stored at the second group of storage nodes and available for access from the second group of storage nodes without access to the first group of storage nodes or the third group of storage nodes;

storing the first block of data chunks at the first group of storage nodes and the second block of data chunks at the second group of storage nodes; and storing a block of code chunks at the third group of storage nodes, wherein each code chunk is generated using an error-correcting code and corresponding data chunks from the first and second blocks, wherein each of the first, second and third groups of storage nodes is within a respective different data center in a different geographic location, and wherein determining that data from the first block is specified to be stored at a first group of storage nodes comprises determining that a geographic location is specified for the data and determining that the geographic location specified for the data is geographically closer to the first group of storage nodes than the second group of storage nodes.

16. The computer storage medium of claim 15, wherein storing the block of error-correcting code chunks at the third group of storage nodes comprises:

determining that a first data chunk of the first block is associated with an identifier;

determining that a second data chunk of the second block is associated with the identifier;

generating a code chunk based on the first and second data chunks; and associating the code chunk with the identifier.

17. The computer storage medium of claim 15, the operations further comprising:

identifying a damaged data chunk at the first group of storage nodes; and reconstructing the damaged chunk using the corresponding data chunk from the second group of storage nodes and the corresponding code chunk from the third group of storage nodes.

18. The computer storage medium of claim 15, the operations further comprising:

receiving an update for the second block of data; and updating the second block of data at the second group of storage nodes and the code chunks at the third group of storage nodes.

19. The computer storage medium of claim 18, wherein the updating is performed in accordance with a transactional commit protocol.

20. The computer storage medium of claim 19, wherein the transactional commit protocol is a two-phase commit protocol.

21. The computer storage medium of claim 15, the operations further comprising storing a first block of error-correcting code chunks at the first group of storage nodes, wherein the first block of error-correcting code chunks are based on the data chunks of the first block of data chunks.

* * * * *